(12) United States Patent
Park et al.

(10) Patent No.: US 10,789,906 B2
(45) Date of Patent: Sep. 29, 2020

(54) GATE DRIVING CIRCUIT

(71) Applicant: SAMSUNG DISPLAY CO., LTD., Yongin-si, Gyeonggi-do (KR)

(72) Inventors: Junhyun Park, Suwon-si (KR); Jonghee Kim, Yongin-si (KR); Sunghwan Kim, Yongin-si (KR); Jaekeun Lim, Suwon-si (KR); Chongchul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 747 days.

(21) Appl. No.: 15/006,000

(22) Filed: Jan. 25, 2016

(65) Prior Publication Data
US 2016/0218707 A1    Jul. 28, 2016

(30) Foreign Application Priority Data

Jan. 27, 2015  (KR) .................... 10-2015-0012980

(51) Int. Cl.
| | | |
|---|---|---|
| *G11C 19/00* | (2006.01) | |
| *G09G 3/36* | (2006.01) | |
| *G11C 19/28* | (2006.01) | |

(52) U.S. Cl.
CPC .......... *G09G 3/3677* (2013.01); *G11C 19/28* (2013.01); *G11C 19/287* (2013.01); *G09G 2300/0408* (2013.01); *G09G 2310/0286* (2013.01); *G09G 2310/08* (2013.01); *G09G 2320/0214* (2013.01)

(58) Field of Classification Search
None
See application file for complete search history.

(56) References Cited

U.S. PATENT DOCUMENTS

| | | | | |
|---|---|---|---|---|
| 4,623,908 A | * | 11/1986 | Oshima ................ | G02F 1/1368 257/66 |
| 6,426,743 B1 | * | 7/2002 | Yeo ...................... | G09G 3/3677 345/100 |
| 7,636,412 B2 | * | 12/2009 | Tobita .................. | G11C 19/28 377/64 |
| 8,023,610 B2 | * | 9/2011 | Miyayama ........... | G11C 19/28 377/64 |
| 8,587,347 B2 | * | 11/2013 | Yoon .................... | G11C 19/184 327/108 |

(Continued)

FOREIGN PATENT DOCUMENTS

| | | |
|---|---|---|
| JP | 2007-207411 A | 8/2007 |
| JP | 2008-217902 A | 9/2008 |

(Continued)

*Primary Examiner* — Tuan T Lam
(74) *Attorney, Agent, or Firm* — Lewis Roca Rothgerber Christie LLP

(57) ABSTRACT

A gate driving circuit includes a plurality of driving stages, wherein an ith (where i is a natural number of 2 or more) driving stage among the plurality of driving stages includes: a output unit outputting an ith output signal including a high voltage generated based on a clock signal in response to a low voltage at a Q-node; a stabilization unit providing the low voltage to the Q-node in response to a switching signal applied to an A-node after the ith output signal is outputted; and an inverter unit outputting the switching signal for controlling the stabilization unit to the A-node.

18 Claims, 11 Drawing Sheets

(56) References Cited

U.S. PATENT DOCUMENTS

| | | | |
|---|---|---|---|
| 2008/0101529 A1* | 5/2008 | Tobita | G09G 3/3677 377/64 |
| 2010/0207928 A1* | 8/2010 | Lee | G09G 3/3677 345/213 |
| 2010/0277206 A1* | 11/2010 | Lee | G09G 3/3677 327/108 |
| 2012/0293467 A1* | 11/2012 | Lee | G09G 3/3677 345/204 |
| 2013/0181747 A1* | 7/2013 | Yoon | G11C 19/184 327/108 |
| 2013/0335392 A1 | 12/2013 | Cho et al. | |
| 2014/0092078 A1* | 4/2014 | Yoon | G09G 5/001 345/212 |
| 2015/0028933 A1* | 1/2015 | Chen | G09G 3/3677 327/382 |
| 2015/0206490 A1* | 7/2015 | Lim | G09G 3/3677 345/92 |
| 2015/0228240 A1* | 8/2015 | Ahn | H03K 17/284 345/213 |
| 2016/0203783 A1* | 7/2016 | Kim | G06F 1/04 345/213 |
| 2016/0293094 A1* | 10/2016 | Park | H03K 17/6871 |
| 2016/0358573 A1* | 12/2016 | Takeuchi | G09G 3/3677 |

FOREIGN PATENT DOCUMENTS

| | | |
|---|---|---|
| JP | 2010-238323 A | 10/2010 |
| KR | 10-2014-0024994 A | 3/2014 |

* cited by examiner

GATE DRIVING CIRCUIT

CROSS-REFERENCE TO RELATED APPLICATION

This patent application claims priority to and the benefit of Korean Patent Application No. 10-2015-0012980, filed on Jan. 27, 2015, the entire content of which is hereby incorporated by reference.

BACKGROUND

The present disclosure herein relates to a gate driving circuit and a display device including the same, and more particularly, to a gate driving circuit integrated to a display panel and a display device having better reliability.

A display device includes a plurality of gate lines, a plurality of data lines, and a plurality of pixels connected to the plurality of gate lines and the plurality of data lines. The display device includes a gate driving circuit providing gate signals to the plurality of gate lines and a data driving circuit outputting data signals to the plurality of data lines.

The gate driving circuit includes a shift register including a plurality of driving stage circuits (hereinafter referred to as driving stages). The plurality of driving stages respectively output gate signals corresponding to the plurality of gate lines. The plurality of driving stages include a plurality of organically-connected transistors, respectively.

SUMMARY

An aspect of an embodiment of the present disclosure is directed toward a gate driving circuit having high reliability through leakage current prevention and a display device including the same.

Embodiments of the inventive concept provide a gate driving circuit including a plurality of driving stages, wherein an ith driving stage of the plurality of driving stages includes: an output unit configured to output an ith output signal, the output signal including a high voltage and a low voltage, the high voltage is generated based on a clock signal in response to a voltage of a Q-node; a stabilization unit configured to provide the low voltage to the Q-node in response to a switching signal applied on an A-node after the ith output signal is outputted; and an inverter unit configured to output the switching signal to the A-node for controlling the stabilization unit, the inverter unit including: a first inverter transistor configured to provide the switching signal generated based on the clock signal to the A-node, in response to a voltage of a B-node; a second inverter transistor configured to control the voltage of the B-node based on the clock signal, in response to the clock signal; and a third inverter transistor configured to output the low voltage in response to the ith output signal, wherein the gate driving circuit is turned on in a section where the ith output signal is outputted to deliver an output of the third inverter transistor to the B-node, wherein i is a natural number equal to or greater than 2.

The first inverter transistor may include an input electrode configured to receive the clock signal, a control electrode connected to the B-node, and an output electrode connected to the A-node; the second inverter transistor may include an input electrode and a control electrode both configured to commonly receive the clock signal and an output electrode connected to the B-node; the third inverter transistor may include an input electrode configured to receive the low voltage, a control electrode configured to receive the ith output signal, and an output electrode connected to an input electrode of the fourth inverter transistor; and the fourth inverter transistor may include an input electrode connected to an output electrode of the third inverter transistor, a control electrode configured to receive the ith output signal, and an output electrode connected to the B-node.

The inverter unit may further include a fifth inverter transistor configured to provide the low voltage to the A-node in response to the ith output signal.

The fifth inverter transistor may include: an input electrode configured to receive the low voltage; a control electrode configured to receive the ith output signal; and an output electrode connected to the A-node.

The stabilization unit may comprise a first stabilization transistor and a second stabilization transistor connected in series to each other and configured to output the low voltage to the Q-node in response to a voltage of the A-node.

The first stabilization transistor may include an input electrode connected to an output electrode of the second stabilization transistor, a control electrode connected to the A-node, and an output electrode connected to the Q-node; and the second stabilization transistor may include an input electrode configured to receive the low voltage, a control electrode connected to the A-node, and an output electrode connected to an input electrode of the first stabilization transistor.

The low voltage may include a first low voltage and a second low voltage, the first low voltage being different from the second low voltage; the ith output signal may include: an ith gate signal including the first low voltage and the high voltage; and an ith carry signal including the second low voltage and the high voltage; and the output unit may include a first output unit configured to output the gate signal, and a second output unit configured to output the ith carry signal.

The ith driving stage may further include a control unit configured to control a potential level of the Q-node during a section where i−1th, ith, and i+1th output signals are outputted.

The ith driving stage may further include: a first pull-down unit configured to pull down the gate signal outputted from the first output unit to the first low voltage; and a second pull-down unit configured to pull down the carry signal outputted from the second output unit to the second low voltage.

The ith driving stage may further include: a first holding unit configured to maintain the gate signal as the first low voltage after the gate signal is pulled down to the first low voltage; and a second holding unit configured to maintain the carry signal as the second low voltage after the carry signal is pulled down to the second low voltage.

The potential level of the second low voltage may be less than a potential level of the first low voltage.

The first inverter transistor may include an input electrode configured to receive the clock signal, a control electrode connected to the B-node, and an output electrode connected to the A-node; the second inverter transistor may include an input electrode and a control electrode both configured to commonly receive the clock signal and an output electrode connected to the B-node; the third inverter transistor may include an input electrode configured to receive the second low voltage, a control electrode configured to receive the output signal, and an output electrode connected to an input electrode of the fourth inverter transistor; and the fourth inverter transistor may include an input electrode connected to an output electrode of the third inverter transistor, a control electrode connected to the Q-node, and an output electrode connected to the B-node.

The gate driving circuit of claim 12, wherein the inverter unit may further include a fifth inverter transistor configured to provide the second low voltage to the A-node in response to the output signal.

The fifth inverter transistor may include: an input electrode configured to receive the second low voltage; a control electrode configured to receive the output signal; and an output electrode connected to the A-node.

The stabilization unit may include a first stabilization transistor and a second stabilization transistor connected in series to each other, and configured to output the low voltage to the Q-node in response to a voltage of the A-node, wherein the first stabilization transistor may include an input electrode connected to an output electrode of the second stabilization transistor, a control electrode connected to the A-node, and an output electrode connected to the Q-node; and the second stabilization transistor may include an input electrode configured to receive the low voltage, a control electrode connected to the A-node, and an output electrode connected to an input electrode of the first stabilization transistor.

The low voltage may include a first low voltage and a second low voltage, the first low voltage being different in level from the second low voltage; the ith output signal may include: an ith gate signal including the first low voltage and the high voltage; and an ith carry signal including the second low voltage and the high voltage; and the output unit may include a first output unit configured to output the gate signal, and a second output unit configured to output the ith carry signal.

The ith driving stage may further include: a control unit configured to control a potential level of the Q-node during a section where i−1th, ith, and i+1th output signals are outputted; a first pull-down unit configured to pull down the gate signal outputted from the first output unit to the first low voltage; a second pull-down unit configured to pull down the carry signal outputted from the second output unit to the second low voltage; a first holding unit configured to maintain the gate signal as the first low voltage after the gate signal is pulled down to the first low voltage; and a second holding unit configured to maintain the carry signal as the second low voltage after the carry signal is pulled down to the second low voltage.

The second low voltage may be less in level than the first low voltage.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
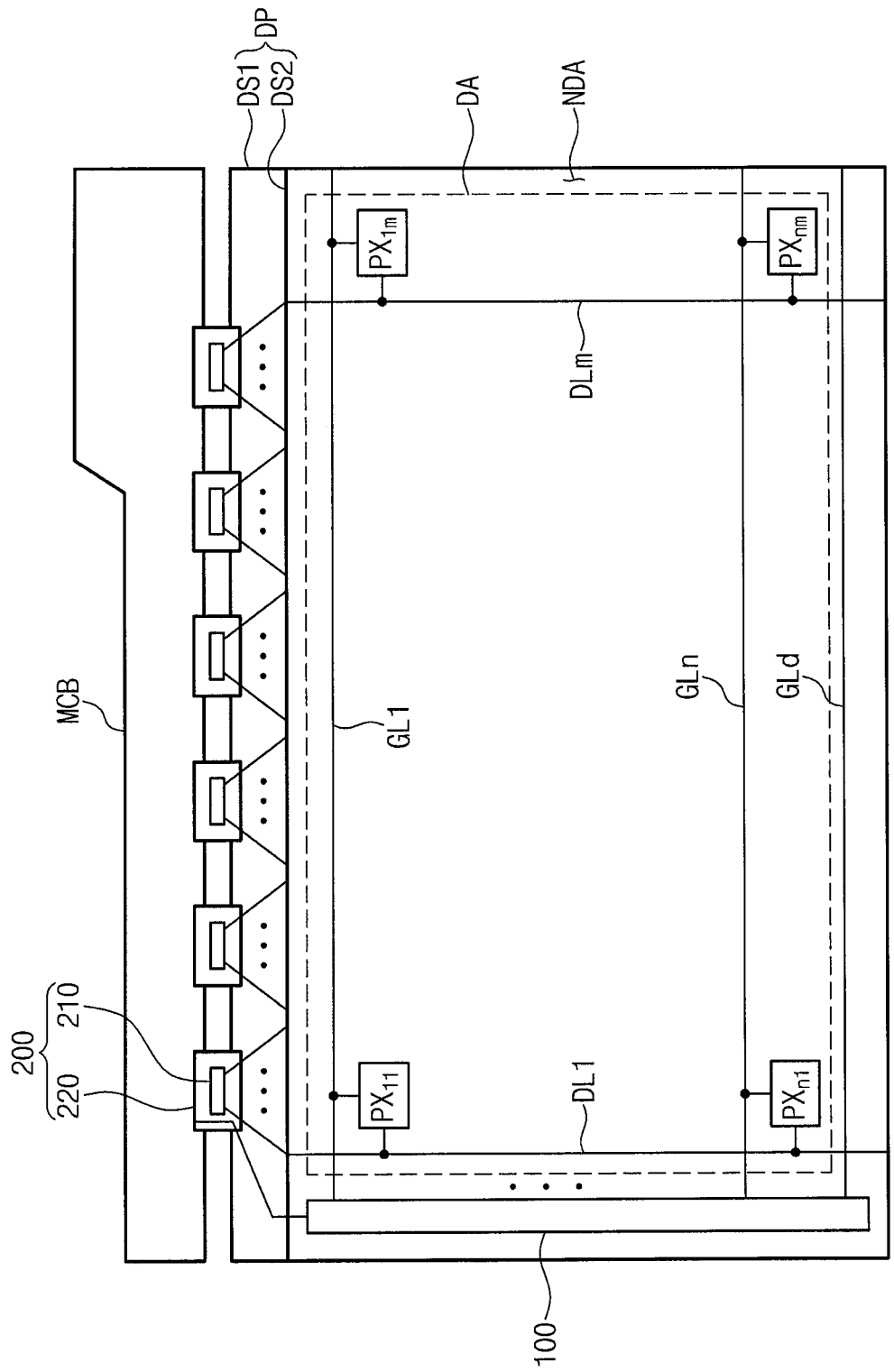
FIG. 1 is a plan view of a display device according to an embodiment of the present disclosure.

Hereinafter, various embodiments of the present disclosure are described in more detail with reference to the accompanying drawings.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

Figure 2:
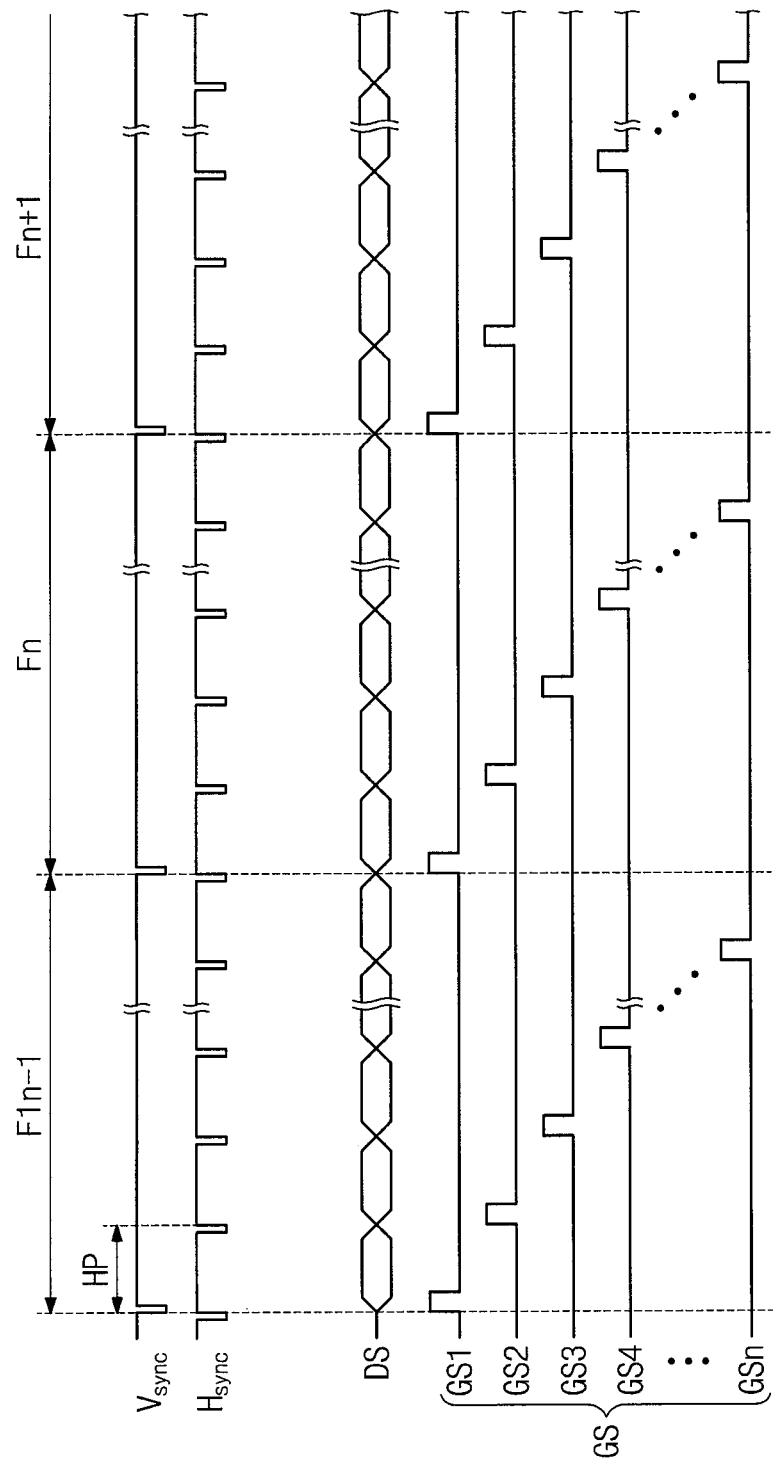
FIG. 2 is a timing diagram of signals of a display device according to an embodiment of the present disclosure.

FIG. 1 is a plan view of a display device according to an embodiment of the present disclosure. FIG. 2 is a timing diagram of signals of a display device according to an embodiment of the present disclosure.

As shown in FIGS. 1 and 2, a display device according to an embodiment of the present disclosure includes a display panel DP, a gate driving circuit 100, and a data driving circuit 200.

The display panel DP is not particularly limited and for example, may include various display panels such as a liquid crystal display panel, an organic light emitting display panel, an electrophoretic display panel, and/or an electrowetting display panel. In an embodiment, the display panel DP is described as a liquid crystal display panel. Moreover, a liquid crystal display device including a liquid crystal display panel may further include a polarizer and a backlight unit.

The display panel DP includes a first substrate DS1, a second substrate DS2 spaced from the first substrate DS1, and a liquid crystal layer LCL (see FIG. 4) disposed between the first substrate DS1 and the second substrate DS2. On a plane, the display panel DP includes a display area DA where a plurality of pixels PX11 to PXnm are disposed and a non display area NDA surrounding the display area DA.

The display panel DP includes a plurality of gate lines GL1 to GLn disposed on the first substrate DS1 and a plurality of data lines DL1 to DLm intersecting (crossing) the plurality of gate lines GL1 to GLn. The plurality of gate lines GL1 to GLn are connected to the gate driving circuit 100. The plurality of data lines DL1 to DLm are connected to the data driving circuit 200. Some of the plurality of gate lines GL1 to GLn and some of the plurality of data lines DL1 to DLm are shown in FIG. 1. Additionally, the display panel DP may further include a dummy gate line GLd disposed in the non display area NDA of the first substrate DS1.

Some of the plurality of pixels PX11~PXnm are shown in FIG. 1. The plurality of pixels PX11~PXnm are respectively connected to corresponding gate lines among the plurality of gate lines GL1 to GLn and corresponding data lines among the plurality of data lines DL1 to DLm. However, the dummy gate line GLd is not connected to the plurality of pixels PX11~PXnm.

The plurality of pixels PX11~PXnm may be divided into a plurality of groups according to colors to be displayed by the pixels. The plurality of pixels PX11~PXnm may display one of primary colors. The primary colors may include red, green, blue, and white. Moreover, the primary colors are not limited thereto and may further include various colors such as yellow, cyan, and/or magenta.

The gate driving circuit 100 and the data driving circuit 200 receive a control signal from a signal control unit (for example, a timing controller). The signal control unit may be mounted on a main circuit board MCB. The signal control unit receives image data and control signals from an external graphic control unit. The control signals may include vertical sync signals Vsync that are signals for distinguishing frame sections Fn−1, Fn, and Fn+1, signals for distinguishing horizontal sections HP (that is, horizontal sync signals Hsync that are row distinction signals), data enable signals that are high levels during a section in which data is outputted in order to display a data incoming zone, and clock signals.

The gate driving circuit 100 generates gate signals GS1~GSn on the basis of a control signal (hereinafter referred to as a gate control signal) received from the signal control unit during the frame sections Fn−1, Fn, and Fn+1, and outputs the gate signals GS1 to GSn to the plurality of gate lines GL1 to GLn. The gate signals GS1~GSn may be sequentially outputted in correspondence to the horizontal sections HP. The gate driving circuit 100 and the pixels PX11 to PXnm may be formed at the same time through a thin film process. For example, the gate driving circuit 100 may be mounted in the non display area NDA as an Amorphous Silicon TFT Gate driver circuit (ASG) form or as an Oxide Semiconductor TFT Gate driver circuit (OSG) form.

FIG. 1 illustrates one gate driving circuit 100 connected to the left ends of the plurality of gate lines GL1 to GLn as an example. In an embodiment of the present disclosure, a display device may include two gate driving circuits. One of the two gate driving circuits may be connected to the left ends of the plurality of gate lines GL1 to GLn and the other one may be connected to the right ends of the plurality of gate lines GL1 to GLn. In other embodiments, one of the two gate driving circuits may be connected to odd gate lines and the other one may be connected to even gate lines.

The data driving circuit 200 generates grayscale voltages according to image data provided from the signal control unit on the basis of a control signal (hereinafter referred to as a data control signal) received from the signal control unit. The data driving circuit 200 outputs grayscale voltages to the plurality of data lines DL1 to DLm as data voltages DS.

The data voltages DS may include positive data voltages having a positive value with respect to a common voltage and/or negative data voltages having a negative value with respect to a common voltage. Some of data voltages applied to the data lines DL1 to DLm during each of the horizontal sections HP may have a positive polarity and others may have a negative polarity. The polarity of the data voltages DS may be reversed according to the frame sections Fn−1, Fn, and Fn+1 in order to prevent the deterioration of liquid crystal. The data driving circuit 200 may generate data voltages inverted by each frame section in response to an inverted signal.

The data driving circuit 200 may include a driving chip 210 and a flexible printed circuit board 220 mounting the driving chip 210. The data driving circuit 200 may include a plurality of driving chips 210 and a flexible printed circuit board 220. The flexible printed circuit board 220 connects a main circuit board MCB and the first substrate DS1. The plurality of driving chips 210 provide data signals corresponding to corresponding data lines among the plurality of data lines DL1 to DLm.

As an example, FIG. 1 illustrates the data driving circuit 200 mounted as a Tape Carrier Package (TCP). In an embodiment of the present disclosure, the data driving circuit 200 may be disposed on the non display area NDA of the first substrate DS1 through a Chip on Glass (COG) method.

Figure 3:
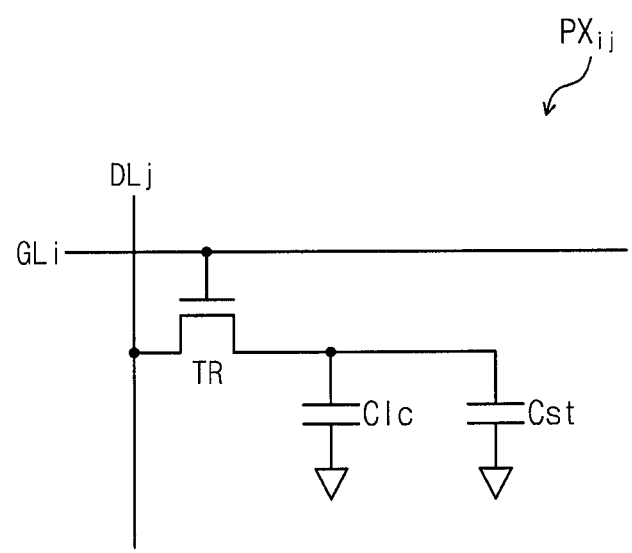
FIG. 3 is an equivalent circuit diagram of a pixel according to an embodiment of the present disclosure.
Figure 4:
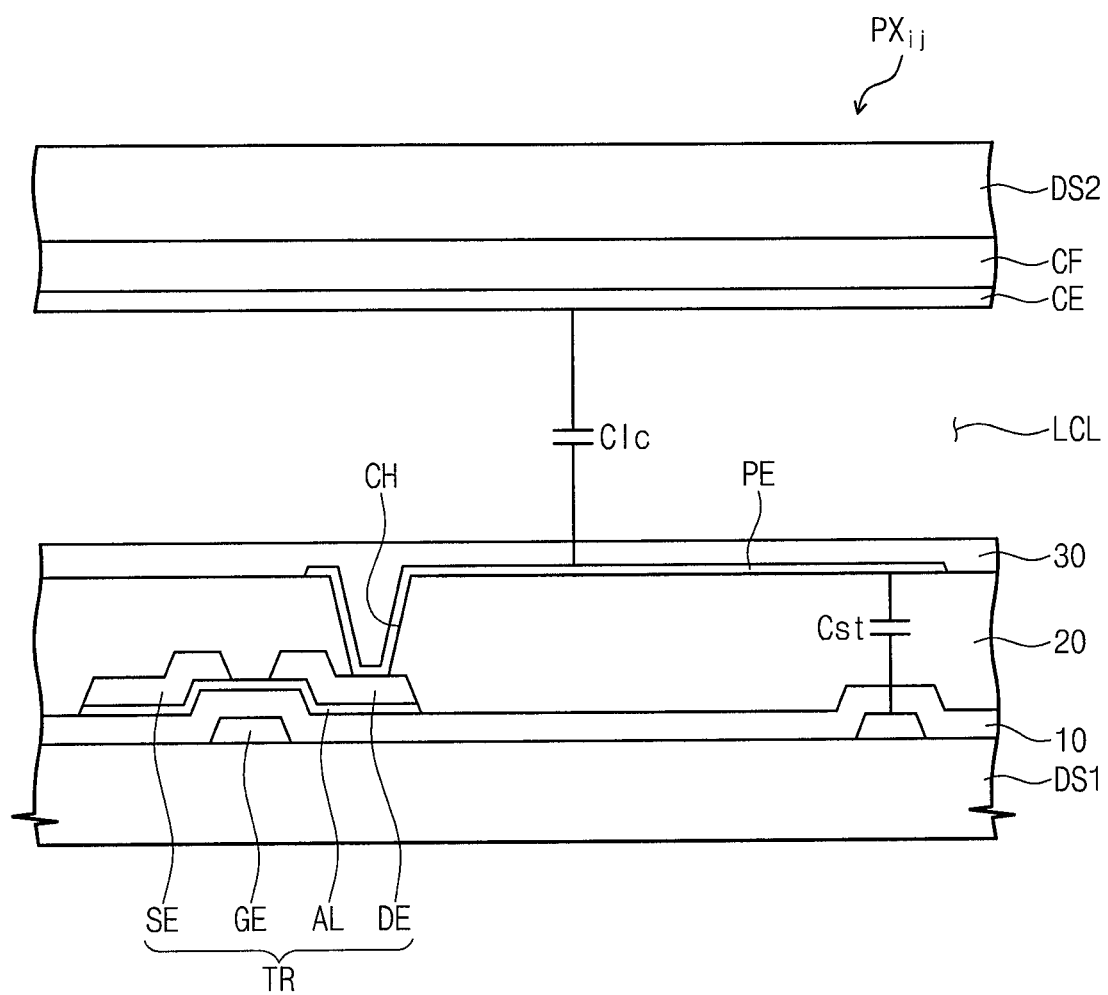
FIG. 4 is a section view of a pixel according to an embodiment of the present disclosure.

FIG. 3 is an equivalent circuit diagram of a pixel according to an embodiment of the present disclosure. FIG. 4 is a section view of a pixel according to an embodiment of the present disclosure. Each of the plurality of pixels PX11 to PXnm shown in FIG. 1 may have an equivalent circuit shown in FIG. 3.

As shown in FIG. 3, the pixel PXij includes a pixel thin film transistor TR (hereinafter referred to as a pixel-transistor), a liquid crystal capacitor Clc, and a storage capacitor Cst. Hereinafter, in this specification, a transistor refers to a thin film transistor. In some embodiments of the present disclosure, the storage capacitor Cst may be omitted.

The pixel-transistor TR is electrically connected to the ith gate line GLi and the jth data line DLj. The pixel-transistor TR outputs a pixel voltage corresponding to a data signal received from the jth data line DLj in response to a gate signal received from the ith gate line GLi.

The liquid crystal capacitor Clc charges a pixel voltage outputted from the pixel-transistor TR. According to a charge amount charged in the liquid crystal capacitor Clc, the arrangement of liquid crystal directors included in a liquid crystal layer LCL (see FIG. 3) is changed. Light incident to the liquid crystal layer LCL may be transmitted or blocked according to the arrangement of liquid crystal detectors.

The storage capacitor Cst is connected in parallel to the liquid crystal capacitor Clc. The storage capacitor Cst maintains the arrangement of liquid crystal directors for a set (e.g., a predetermined) section.

As shown in FIG. 4, a pixel-transistor TR-P includes a control electrode GE (hereinafter referred to as a pixel control electrode) connected to the ith gate line GLi (see FIG. 2), an activation layer AL (hereinafter referred to as a pixel activation layer) overlapping the pixel control electrode GE, an input electrode SE (hereinafter referred to as a pixel input electrode) connected to the jth data line DLj (see FIG. 2), and an output electrode DE (hereinafter referred to as a pixel output electrode) spaced from the pixel input electrode SE.

The liquid crystal capacitor Clc includes a pixel electrode PE and a common electrode CE. The storage capacitor Cst includes a pixel electrode PE and a portion of a storage line STL overlapping the pixel electrode PE.

The ith gate line GLi and the storage line STL are disposed on one surface of the first substrate DS1. The pixel control electrode GE is branched from the ith gate line GLi. The ith gate line GLi and the storage line STL may include metals such as Al, Ag, Cu, Mo, Cr, Ta, and Ti, and/or an alloy thereof. The ith gate line GLi and the storage line STL may have a multi-layer structure including a Ti layer and/or a Cu layer.

A first insulating layer 10 covering the pixel control electrode GE and the storage line STL is disposed on one surface of the first substrate DS1. The first insulating layer 10 may include at least one of inorganic matter and organic matter. The first insulating layer 10 may be an organic layer or an inorganic layer. The first insulating layer 10 may have a multi-layer structure including a silicon nitride layer and a silicon oxide layer, for example.

The pixel activation layer AL overlapping the pixel control electrode GE is disposed on the first insulating layer 10. The pixel activation layer AL may include a semiconductor layer and an ohmic contact layer.

The pixel activation layer AL may include amorphous silicon and poly silicon. Additionally, the pixel activation layer AL may include metal oxide semiconductor.

The pixel output electrode DE and the pixel input electrode SE are disposed on the pixel activation layer AL. The pixel output electrode DE and the pixel input electrode SE are spaced apart from each other. Each of the pixel output electrode DE and the pixel input electrode SE partially overlaps the pixel control electrode GE.

Although a pixel-transistor TR having a staggered structure is exemplarily shown in FIG. 4, a structure of a pixel-transistor TR-P is not limited thereto. The pixel-transistor TR may have a planar structure.

A second insulating layer 20 covering the pixel activation layer AL, the pixel output electrode DE, and the pixel input electrode SE is disposed on the first insulating layer 10. The second insulating layer 20 provides a flat surface. The second insulating layer 20 may include organic matter.

The pixel electrode PE is disposed on the second insulating layer 20. The pixel electrode PE is connected to the second insulating layer 20 and the pixel output electrode DE through a contact hole CH penetrating the second insulating layer 20. An orientation layer 30 covering the pixel electrode PE may be disposed on the second insulating layer 20.

A color filter layer CF may be disposed on one surface of the second substrate DS2. The common electrode CE is disposed on the color filter layer CF. A common voltage is applied to the common electrode CE. A common voltage and a pixel voltage have different values. An orientation layer covering the common electrode CE may be disposed on the common electrode CE. Another insulating layer may be disposed between the color filter layer CF and the common electrode CE.

The pixel electrode PE and the common electrode CE disposed with the liquid crystal layer LCL therebetween form the liquid crystal capacitor Clc. Additionally, the pixel electrode PE and a portion of the storage line STL disposed with the first insulating layer 10 and the second insulating layer 20 therebetween form the storage capacitor Cst. The storage line STL receives a storage voltage having a different value than a pixel voltage. A storage voltage may have the same value as a common voltage.

Moreover, a section of the pixel PXij shown in FIG. 4 is just one example. Unlike FIG. 4, at least one of the color filter layer CF and the common electrode CE may be disposed on the first substrate DS1. That is, a liquid crystal display panel according to this embodiment may include pixels in a Vertical Alignment (VA) mode, a Patterned Vertical Alignment (PVA) mode, an in-plane switching (IPS) mode, a fringe-field switching (FFS) mode, and/or a Plane to Line Switching (PLS) mode.

Figure 5:
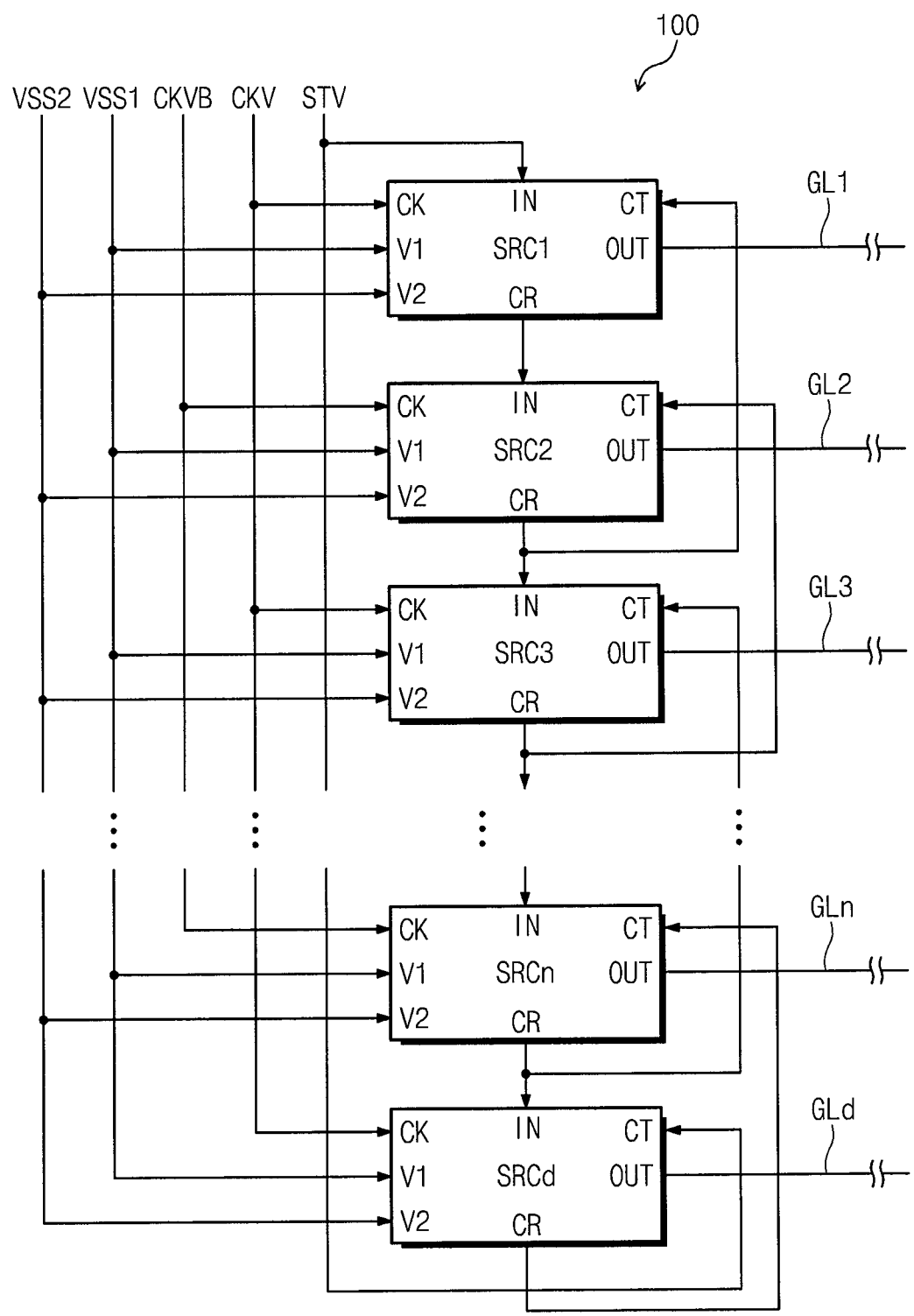
FIG. 5 is a block diagram of a gate driving circuit according to an embodiment of the present disclosure.

FIG. 5 is a block diagram of a gate driving circuit according to an embodiment of the present disclosure. As shown in FIG. 5, the gate driving circuit 100 includes a plurality of driving stages SRC1 to SRCn. The plurality of driving stages SRC1 to SRCn are connected in cascaded arrangement to each other.

In this embodiment, the plurality of driving stages SRC1 to SRCn are respectively connected to the plurality of gate lines GL1 to GLn. The plurality of driving stages SRC1 to SRCn respectively provide gate signals to the plurality of gate lines GL1 to GLn. In an embodiment of the present disclosure, gate lines connected to the plurality of driving stages SRC1 to SRCn may be odd gate lines or even gate lines among entire gate lines.

The gate driving circuit 100 may further include a dummy stage SRCd connected to the driving stage SRCn disposed at the terminal among the plurality of driving stages SRC1 to SRCn. The dummy stage SRCd is connected to the dummy gate line GLd.

Each of the plurality of driving stages SRC1 to SRCn includes an output terminal OUT, a carry terminal CR, an input terminal IN, a control terminal CT, a clock terminal CK, a first voltage input terminal V1, and a second voltage input terminal V2.

The output terminal OUT of each of the plurality of driving stages SRC1 to SRCn is connected to a corresponding gate line among the plurality of gate lines GL1 to GLn. Gate signals generated from the plurality of driving stages SRC1 to SRCn are provided to the plurality of gate lines GL1 to GLn through the output terminal OUT.

The carry terminal CR of each of the plurality of driving stages SRC1 to SRCn is electrically connected to the input terminal IN of the next driving stage of a corresponding driving stage. The carry terminal CR of each of the plurality of driving stages SRC1 to SRCn outputs a carry signal.

The input terminal IN of each of the plurality of driving stages SRC1 to SRCn receives a carry signal of the previous driving stage of a corresponding driving stage. For example, the input terminal IN of the third driving stage SRC3 receives a carry signal of the second driving stage SRC2. The input terminal IN of the first driving stage SRC1 among the plurality of driving stages SRC1 to SRCn receives a start signal STV for starting the driving of the gate driving circuit 100 instead of a carry signal of a previous driving stage.

The control terminal CT of each of the plurality of driving stages SRC1 to SRCn is electrically connected to the carry terminal CR of the next driving stage of a corresponding driving stage. The control terminal CT of each of the plurality of driving stages SRC1 to SRCn receives a carry signal of the next driving stage of a corresponding driving stage. For example, the control terminal CT of the second driving stage SRC2 receives a carry signal outputted from the carry terminal CR of the third driving stage SRC3. In an embodiment of the present disclosure, the control terminal CT of each of the plurality of driving stages SRC1 to SRCn may be electrically connected to the output terminal OUT of the next driving stage of a corresponding driving stage.

The control terminal CT of the nth driving stage SRCn disposed at the terminal receives a carry signal outputted from the carry terminal CR of the dummy stage SRCd. The control terminal CT of the dummy stage SRCd receives a start signal STV.

The clock terminal CK of each of the plurality of driving stages SRC1 to SRCn receives one of the first clock signal CKV and the second clock signal CKVB. Each of the clock terminals CK of the odd driving stages SRC1 and SRC3 among the plurality of driving stages SRC1 to SRCn receives the first clock signal CKV. Each of the clock terminals CK of the even driving stages SRC2 and SRCn among the plurality of driving stages SRC1 to SRCn receives the second clock signal CKVB. The first clock signal CKV and the second clock signal CKVB may be signals having different phases.

The first voltage input terminal V1 of each of the plurality of driving stages SRC1 to SRCn receives a first low voltage VSS1. The second voltage input terminal V2 of each of the plurality of driving stages SRC1 to SRCn receives a second low voltage VSS2. The second low voltage VSS2 has a lower voltage level than the first low voltage VSS1.

In an embodiment of the present disclosure, each of the plurality of driving stages SRC1 to SRCn may omit any one of an output terminal OUT, an input terminal IN, a carry terminal CR, a control terminal CT, a clock terminal CK, a first voltage input terminal V1, and/or a second voltage input terminal V2 and/or may further include other terminals, according to the circuit configuration. For example, any one of the first voltage input terminal V1 and the second voltage input terminal V2 may be omitted. Additionally, the connection relationship of the plurality of driving stages SRC1 to SRCn may also be changed.

Figure 6:
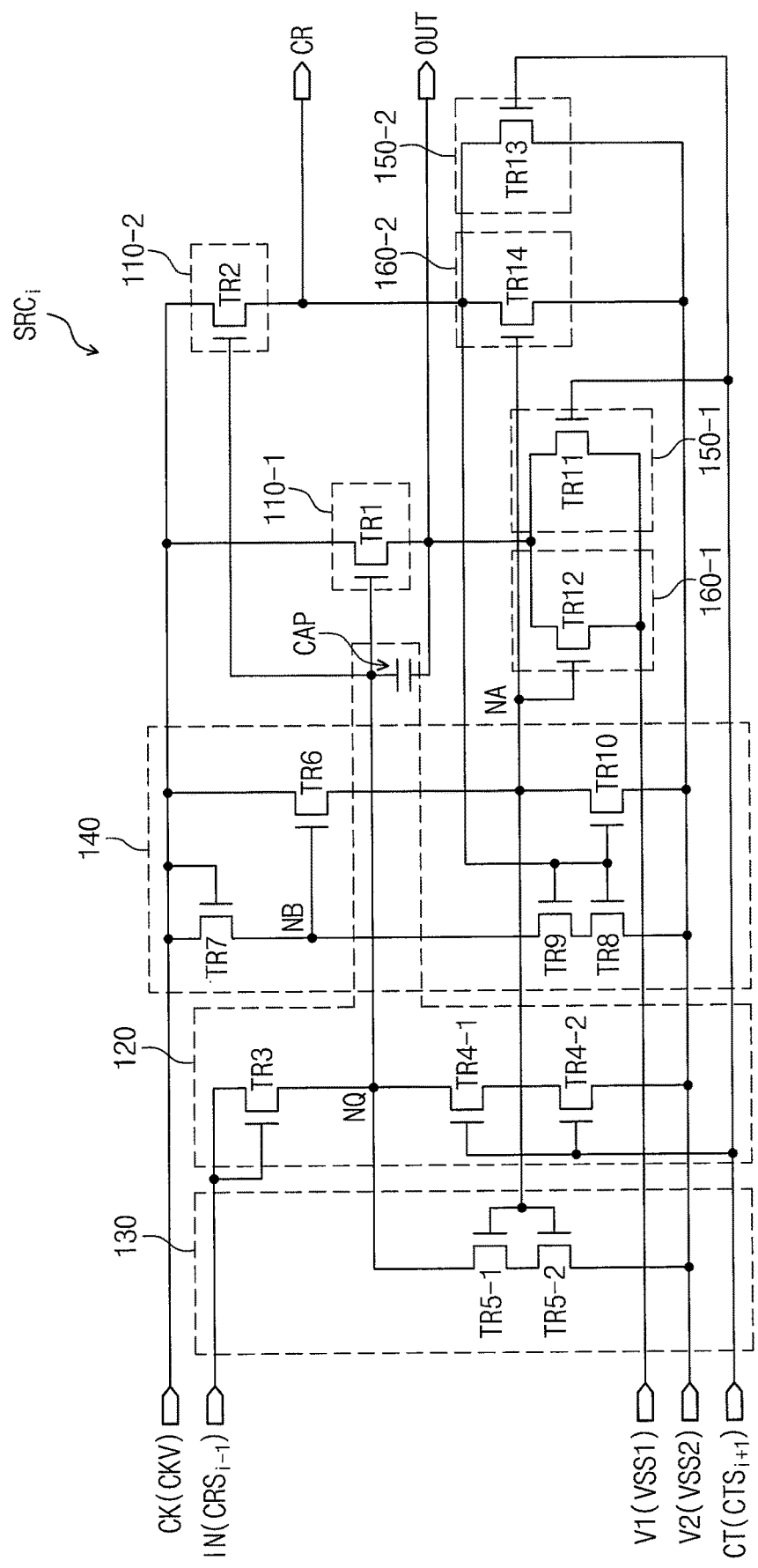
FIG. 6 is a circuit diagram of an ith driving stage among a plurality of stages shown in FIG. 5.
Figure 7:
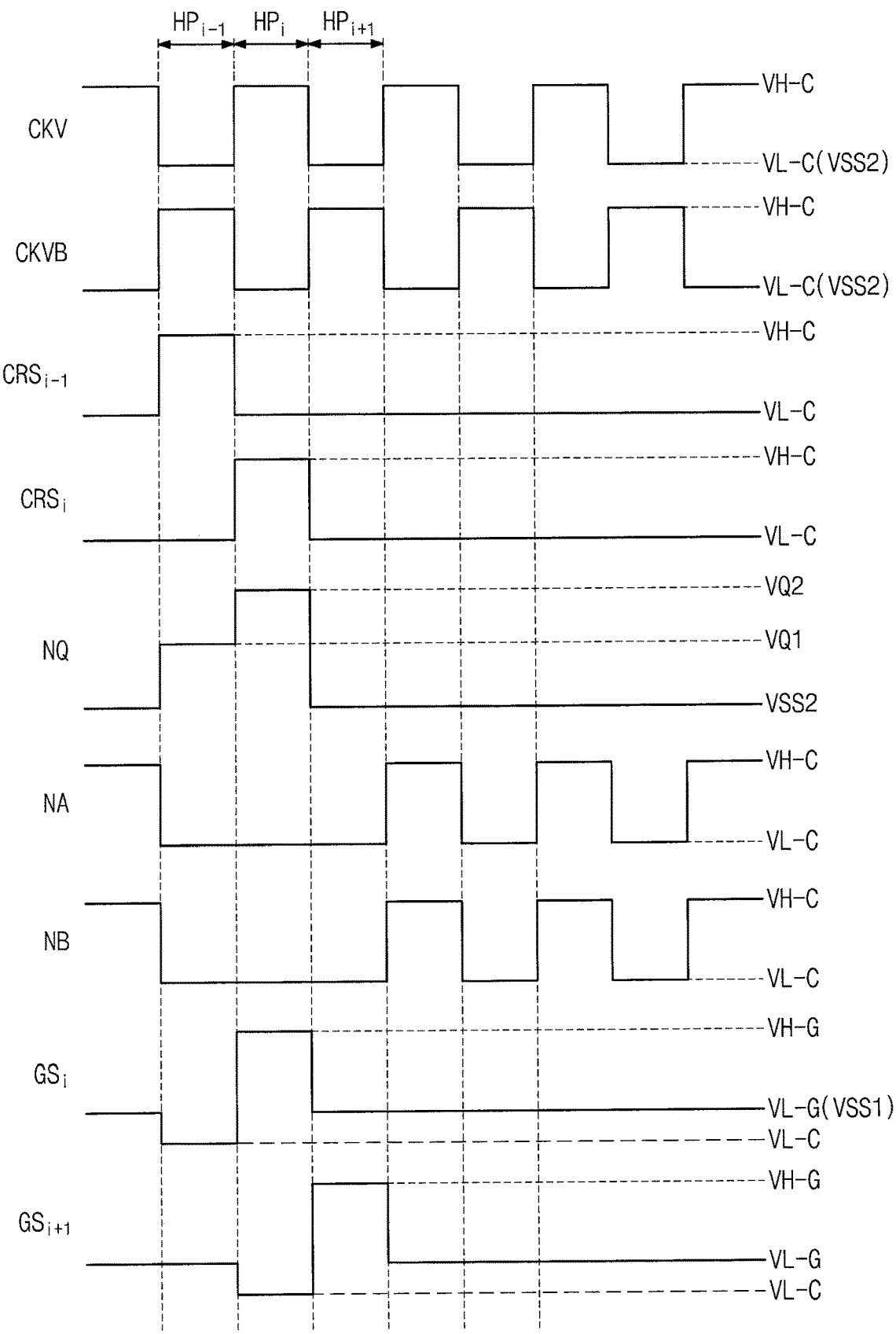
FIG. 7 is an input/output signal waveform diagram of the ith stage shown in FIG. 6.

FIG. 6 is a circuit diagram of an ith driving stage among a plurality of driving stages shown in FIG. 5. FIG. 7 is an input/output signal waveform diagram of the ith driving stage shown in FIG. 6.

FIG. 6 illustrates an ith driving stage SRCi exemplarily among the plurality of driving stages SRC1 to SRCn shown in FIG. 5. Each of the plurality of driving stages SRC1 to SRCn shown in FIG. 6 may have the same circuit as the ith driving stage SRCi.

Referring to FIGS. 6 and 7, the ith driving stage SRCi includes output units 110-1 and 110-2, a control unit 120, a stabilization unit 130, an inverter unit 140, pull-down units 150-1 and 150-2, and holding units 160-1 and 160-2. The output units 110-1 and 110-2 include the first output unit 110-1 outputting an ith gate signal GSi and the second output unit 110-2 outputting an ith carry signal CRSi. The pull-down units 150-1 and 150-2 include the first pull down unit 150-1 pulling down an output terminal OUT and the second pull-down unit 150-2 pulling down a carry terminal CR. The holding units 160-1 and 160-2 include the first holding unit 160-1 holding an output terminal OUT in a down state and the second holding unit 160-2 holding a carry terminal CR in a down state.

The circuit of the ith driving stage SRCi is exemplary and may vary.

The first output unit 110-1 includes a first output transistor TR1. The first output transistor TR1 includes an input electrode for receiving a first clock signal CKV, a control electrode connected to a Q-node NQ, and an output electrode for outputting an ith gate signal GSi.

The second output unit 110-2 includes a second output transistor TR2. The second output transistor TR2 includes an input electrode for receiving a first clock signal CKV, a control electrode connected to a Q-node NQ, and an output electrode for outputting an ith carry signal CRSi.

As shown in FIG. 7, the first clock signal CKV and the second clock signal CKVB may be phase-inverted signals. The first clock signal CKV and the second clock signal CKVB may have a phase difference of 180 degrees. Each of the first clock signal CKV and the second clock signal CKVB includes low sections VL-C (i.e., low voltage) of a low level and high sections VH-C (i.e., high voltage) of a relatively high level. Each of the first clock signal CKV and the second clock signal CKVB includes alternating low sections and high sections. The high voltage VH-C may be about 10 V. The low voltage VL-C may be about −16 V. The low voltage VL-C and the second low voltage VSS2 may have substantially the same level (e.g., the same level).

The ith gate signal GSi includes a low section VL-G (i.e., low voltage) of a low level and a high section VH-G (i.e., high voltage) of a relatively high level. The low voltage VL-G of the ith gate signal GSi may have substantially the same level (e.g., the same level) as the first low voltage VSS1. The low voltage VL-G may be about −13 V.

The ith gate signal GSi may have substantially the same level (e.g., the same level) as the low voltage VL-C of the first clock signal CKV during some sections. The low voltage VL-C of the first clock signal CKV is outputted by a pre-charged Q-node before the ith gate signal GSi becomes the high voltage VH-G.

The high voltage VH-G of the ith gate signal GSi may have substantially the same level (e.g., the same level) as the high voltage VH-C of the first clock signal CKV or the second clock signal CKVB.

The ith carry signal CRSi includes a low section VL-C (i.e., low voltage) of a low level and a high section VH-C (i.e., high voltage) of a relatively high level. Since the ith carry signal CRSi is generated based on the first clock signal CKV, it has the same or similar voltage level to the first clock signal CKV.

Referring to FIGS. 6 and 7, the control unit 120 controls a potential level of the Q-node NQ during a section in which i−1th, ith, and i+1th gate signals and carry signals are outputted. The control unit 120 turns on the first output unit 110-1 and the second output unit 110-2 in response to the i−1th carry signal CRSi−1 outputted from the i−1th driving stage SRCi−1. The control unit 120 turns off the first output unit 110-1 and the second output unit 110-2 in response to the i+1th carry signal CRSi+1 outputted from the i+1th driving stage SRCi+1.

The control unit 120 includes a first control transistor TR3, two second control transistors TR4-1 and TR4-2, and a capacitor CAP. In this embodiment and as an example, the two second control transistors TR4-1 and TR4-2 connected in series are shown.

The first control transistor TR3 outputs a control signal for controlling the potential of the Q-node NQ to the Q-node NQ. FIG. 7 illustrates a horizontal section HPi (hereinafter referred to as an ith horizontal section) where an ith gate signal GSi is outputted, an immediately previous horizontal section HPi−1 (hereinafter referred to as an i-th horizontal section), and an immediately after horizontal section HPi+1 (hereinafter referred to as an i+1th horizontal section) among a plurality of horizontal sections.

The first control transistor TR3 is connected in a diode form (e.g., diode-connected) between the input terminal IN and the Q-node NQ so as to form a current pass from the input terminal IN to the Q-node NQ. The first control transistor TR3 includes a control electrode commonly connected to the input terminal IN and an output electrode connected to the Q-node NQ.

The capacitor CAP is connected between the output electrode of the first output transistor TR1 and the control electrode (or the Q-node NQ) of the first output transistor TR1.

Two second control transistors TR4-1 and TR4-2 are connected in series between the second voltage input terminal V2 and the Q-node NQ. The control electrodes of the two second control transistors TR4-1 and TR4-2 are commonly connected to the control terminal CT. The two second control transistors TR4-1 and TR4-2 provide a second low voltage VSS2 to the Q-node NQ in response to the i+1th carry signal outputted from the i+1th driving stage. In an embodiment of the present disclosure, the two second control transistors TR4-1 and TR4-2 may be turned on by the i+1th gate signal GSi+1.

In an embodiment of the present disclosure, any one of the two second control transistors TR4-1 and TR4-2 may be omitted. Additionally, the second control transistors TR4-1 and TR4-2 may be connected to the first voltage input terminal V1 instead of the second voltage input terminal V2. The shown second control transistors TR4-1 and TR4-2 may be equivalent to one transistor including a floating electrode. The floating electrode is disposed between an input electrode and an output electrode, on an activation layer of a transistor. Then, the floating electrode is spaced apart from the input electrode and the output electrode. The floating electrode may include the same material as the input electrode and the output electrode. The floating electrode may lengthen the length of a channel area formed in an activation layer of a transistor.

Referring to FIGS. 6 and 7, the stabilization unit 130 maintains the first output unit 110-1 and the second output unit 110-2 to be turned-off in response to a switching signal outputted from the inverter unit 140.

The stabilization unit 130 includes a first stabilization transistor TR5-1 and a second stabilization transistor TR5-2. In this embodiment and as an example, the series-connected first stabilization transistor TR5-1 and second stabilization transistor TR5-2 are shown.

The first stabilization transistor TR5-1 and the second stabilization transistor TR5-2 are connected in series between the second voltage input terminal V2 and the Q-node NQ. The control electrodes of the first stabilization transistor TR5-1 and the second stabilization transistor TR5-2 are commonly connected to the A-node NA. The first stabilization transistor TR5-1 and the second stabilization transistor TR5-2 provide a second low voltage VSS2 to the Q-node NQ in response to a switching signal outputted from the inverter unit 140. The shown first stabilization transistor TR5-1 and second stabilization transistor TR5-2 may be equivalent to one transistor including a floating electrode.

In an embodiment of the present disclosure, any one of the first stabilization transistor TR5-1 and the second stabilization transistor TR5-2 may be omitted. Additionally, the first stabilization transistor TR5-1 and the second stabilization transistor TR5-2 may be connected to the first voltage input terminal V1 instead of the second voltage input terminal V2.

As shown in FIG. 7, the potential of the Q-node NQ during the i−1th horizontal section HPi−1 rises to the first high voltage VQ1 by the i−1th carry signal CRSi−1. When the i−1th carry signal CRSi−1 is applied to the Q-node NQ, the capacitor CAP charges voltage corresponding thereto. The ith gate signal GSi is outputted during the ith horizontal section HPi. At this point, the Q-node NQ is boosted from the first high voltage VQ1 to the second high voltage VQ2.

During the i+1th horizontal section HPi+1, the voltage of the Q-node NQ is down to the second low voltage VSS2. Accordingly, the first output transistor TR1 and the second output transistor TR2 are turned off. Until the ith gate signal GSi of the next frame section after the i+1th horizontal section HPi+1 is outputted, the voltage of the Q-node NQ is maintained at the second low voltage VSS2. Accordingly, until the ith gate signal GSi of the next frame section after the i+1th horizontal section HPi+1 is outputted, the off states of the first output transistor TR1 and the second output transistor TR2 are maintained.

Referring to FIGS. 6 and 7, the inverter unit 140 outputs a switching signal to the A-node NA. The inverter unit 140 includes first to fifth inverter transistors TR6, TR7, TR8, TR9, and TR10.

The first inverter transistor TR6 provides a switching signal generated based on the first clock signal CKV to the A-node NA in response to the voltage of the B-node NB. The first inverter transistor TR6 includes an input electrode connected to the clock terminal CK, an output electrode connected to the A-node NA, and a control electrode connected to the B-node NB.

The second inverter transistor TR7 controls the voltage of the B-node NB in response the first clock signal CKV. The second inverter transistor TR7 includes an input electrode and a control electrode that are commonly connected to the clock terminal CK and an output terminal connected to the B-node NB.

In another embodiment of the present disclosure, the second inverter transistor TR7 may include a floating electrode.

The third inverter transistor TR8 outputs the second low voltage VSS2 in response to the ith carry signal CRSi. The third inverter transistor TR8 includes an input electrode for receiving the second low voltage VSS2, a control electrode for receiving the ith carry signal CRSi, and an output electrode connected to the input electrode of the fourth inverter transistor TR9.

The fourth inverter transistor TR9 delivers the output of the third inverter transistor TR8 in response to the ith carry signal CRSi. The fourth inverter transistor TR9 includes an input electrode connected to the output electrode of the third inverter transistor TR8, a control electrode for receiving the ith carry signal CRSi, and an output electrode connected to the B-node NB.

The shown third inverter transistor TR8 and the shown fourth inverter transistor TR9 may be equivalent to one transistor including a floating electrode. At this point, the control electrode may be connected to the Q-node NQ or the carry terminal CR.

The fifth inverter transistor TR10 provides a second low voltage VSS2 to the A-node NA in response to the ith carry signal CRSi. The fifth inverter transistor TR10 includes an input electrode for receiving the second low voltage VSS2, a control electrode for receiving the ith carry signal CRSi, and an output electrode connected to the A-node NA.

In another embodiment of the present disclosure, the control electrodes of the third to fifth inverter transistors TR8, TR9, and TR10 may be connected to the output terminal OUT to receive the ith gate signal GSi. The input electrodes of the third and fifth inverter transistors TR8 and TR10 may be connected to the first voltage input terminal V1.

As the fourth inverter transistor TR9 is connected in series to the third inverter transistor TR8, a first leakage current flowing from the B-node NB into the second voltage input terminal V2 may be prevented or reduced. If the first leakage current is prevented or reduced, as a result, a second leakage current flowing from the Q-node NQ into the second voltage input terminal V2 is prevented or reduced, so that an output of the Q-node NQ may be constant at each of the horizontal sections HP1 to HPn. This will be described in more detail with reference to FIGS. 8 to 11.

As shown in FIG. 7, the A-node NA has the same phase substantially as the first clock signal CKV, except for the i-th horizontal section HP-i. Then, the B-node NB has substantially the same phase as the A-node NA. During the ith horizontal section HPi, the third to fifth inverter transistors TR8, TR9, and TR10 are turned on in response to the ith carry signal CRSi. At this point, the high voltage VH-C of the first clock signal CKV outputted from the first inverter transistor TR6 is discharged into the second low voltage VSS2. During sections other than the ith horizontal section HPi, the high voltage VH-C and the low voltage VL-C of the first clock signal CKV outputted from the first inverter transistor TR6 are provided into the A-node NA. The alternating high voltage VH-C and low voltage VL-C of the first clock signal CKV are provided to other transistors as a switching signal.

The first pull-down unit 150-1 includes a first pull-down transistor TR11. The first pull-down transistor TR11 includes an input electrode connected to the first voltage input terminal V1, a control electrode connected to the control terminal CT, and an output electrode connected to the output electrode of the first output transistor TR1. In another embodiment of the present disclosure, the input electrode of the first pull-down transistor TR11 may be connected to the second voltage input terminal V2.

As shown in FIG. 7, the voltage of the ith gate signal GSi after the i+1th horizontal section HPi+1 corresponds to the voltage of the output electrode of the first output transistor TR1. During the i+1th horizontal section HPi+1, the first pull-down transistor TR11 provides a first low voltage VSS1 to the output terminal OUT in response to the i+1th carry signal.

The second pull-down unit 150-2 includes a second pull-down transistor TR13. The second pull-down transistor TR13 includes an input electrode connected to the second voltage input terminal V2, a control electrode connected to the control terminal CT, and an output electrode connected to the output electrode of the second output transistor TR2. In another embodiment of the present disclosure, the input electrode of the second pull-down transistor TR13 may be connected to the first voltage input terminal V1.

As shown in FIG. 7, the voltage of the ith carry signal CRSi after the i+1th horizontal section HPi+1 corresponds to the voltage of the output electrode of the second output transistor TR2. During the i+1th horizontal section HPi+1, the second pull-down transistor TR13 provides a second low voltage VSS2 to the carry terminal CR in response to the i+1th carry signal.

The first holding unit 160-1 includes a first holding transistor TR12. The first holding transistor TR12 includes an input electrode connected to the first voltage input terminal V1, a control electrode connected to the A-node NA, and an output electrode connected to the output electrode of the first output transistor TR1. In another embodiment of the present disclosure, the input electrode of the first holding transistor TR12 may be connected to the second voltage input terminal V2.

As shown in FIG. 7, the first holding transistor TR12 after the i+1th horizontal section HPi+1 provides a first low voltage VSS1 to the output electrode of the first output transistor TR1 in response to a switching signal outputted from the A-node NA.

The second holding unit 160-2 includes a second holding transistor TR14. The second holding transistor TR14 includes an input electrode connected to the second voltage input terminal V2, a control electrode connected to the A-node NA, and an output electrode connected to the output electrode of the second output transistor TR2. In another embodiment of the present disclosure, the input electrode of the second holding transistor TR14 may be connected to the first voltage input terminal V1.

As shown in FIG. 7, the second holding transistor TR14 after the i+1th horizontal section HPi+1 provides a second low voltage VSS2 to the output electrode of the second output transistor TR2 in response to a switching signal outputted from the A-node NA.

Figure 8:
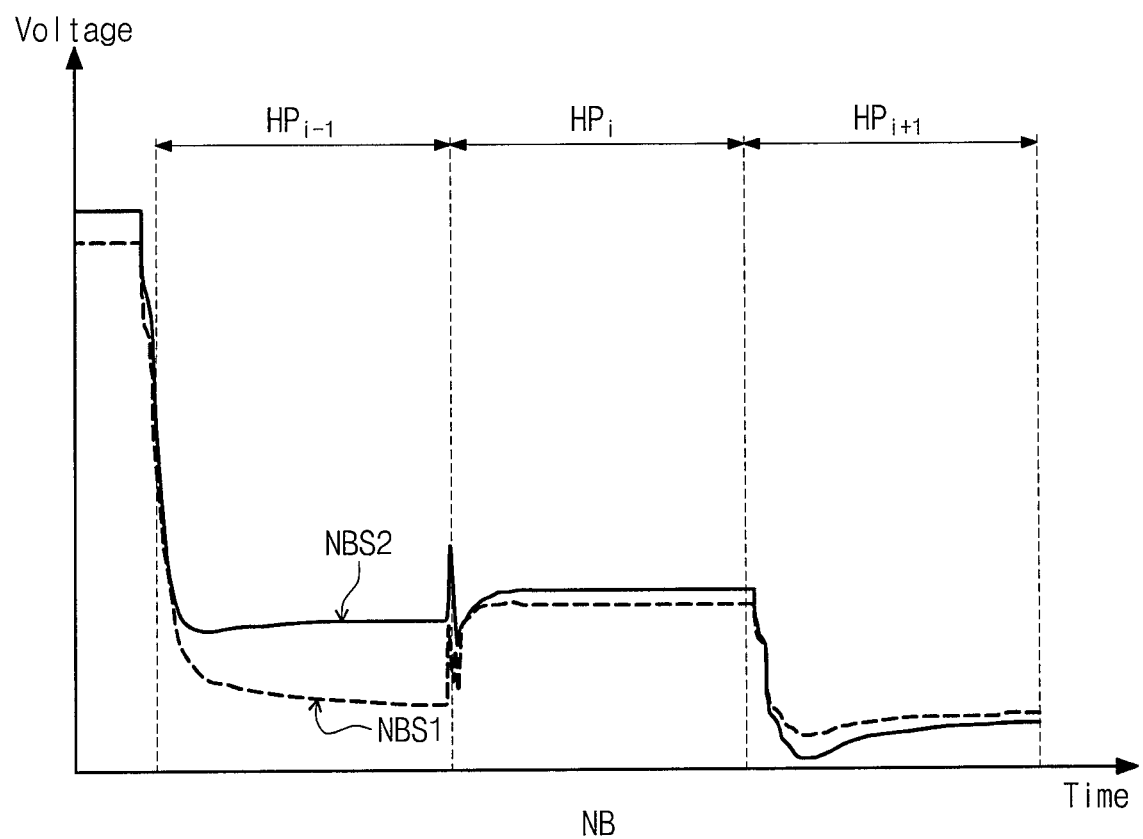
FIG. 8 is an output signal waveform diagram of a B-node NB shown in FIG. 6.

FIG. 8 is an output signal waveform diagram of a B-node NB shown in FIG. 6. A first B-node signal NBS1 and a second B-node signal NBS2 in an i−1th horizontal section HPi−1, an ith horizontal section HPi, and an i+1th horizontal section HPi+1 are shown in FIG. 8.

Unlike as shown in FIG. 6, if there is no fourth inverter transistor TR9 (see FIG. 6), the first B-node signal NBS1 is a signal outputted from the B-node NB. As shown in FIG. 6, if there is the fourth inverter transistor TR9 (see FIG. 6), the second B-node signal NBS2 is a signal outputted from the B-node NB. The first B-node signal NBS1 and the second B-node signal NBS2 have a common condition in that they are maintained in a low voltage state in an i−1th horizontal section HPi−1, an ith horizontal section HPi, and an i+1th horizontal section HPi+1. However, there is a slight difference in a potential level of a low voltage state and in particular, the potential level difference in the i-th horizontal section HPi−1 is greater and in the ith horizontal section HPi, and the i+1th horizontal section HPi+1.

When the first clock signal CKV (see FIG. 7) and the second clock signal CKVC (see FIG. 7) are applied to each of the driving stages SRC1 to SRCn, a delay occurs due to internal resistance. As the first clock signal CKV (see FIG. 7) and the second clock signal CKVC (see FIG. 7) are delayed, a weak voltage rise occurs from the ith carry signal CRSi in the i−1th horizontal section HPi−1. Accordingly, in the ith driving stage SRCi where there is no fourth inverter transistor TR9, the third inverter transistor TR8 generates a first leakage current flowing from the B-node NB into the second voltage input terminal V2 in response to a weak voltage rise of the ith carry signal CRSi generated from the i−1th horizontal section HPi−1.

On the other hand, as shown in FIG. 6, when the inverter unit 140 includes the fourth inverter transistor TR9, it is more difficult for current to flow in the third inverter transistor TR8 due to the resistance that is increased by series-connected transistors. Accordingly, due to the addition of the fourth inverter transistor TR9, the ith driving stage SRCi may prevent or reduce the occurrence of a first leakage current. Accordingly, in the i-th horizontal section HPi−1, a potential level of the second B-node signal NBS2 not affected by the first leakage current is higher compared to a potential level of the first B-node signal NBS1 affected by the first leakage current.

Figure 9:
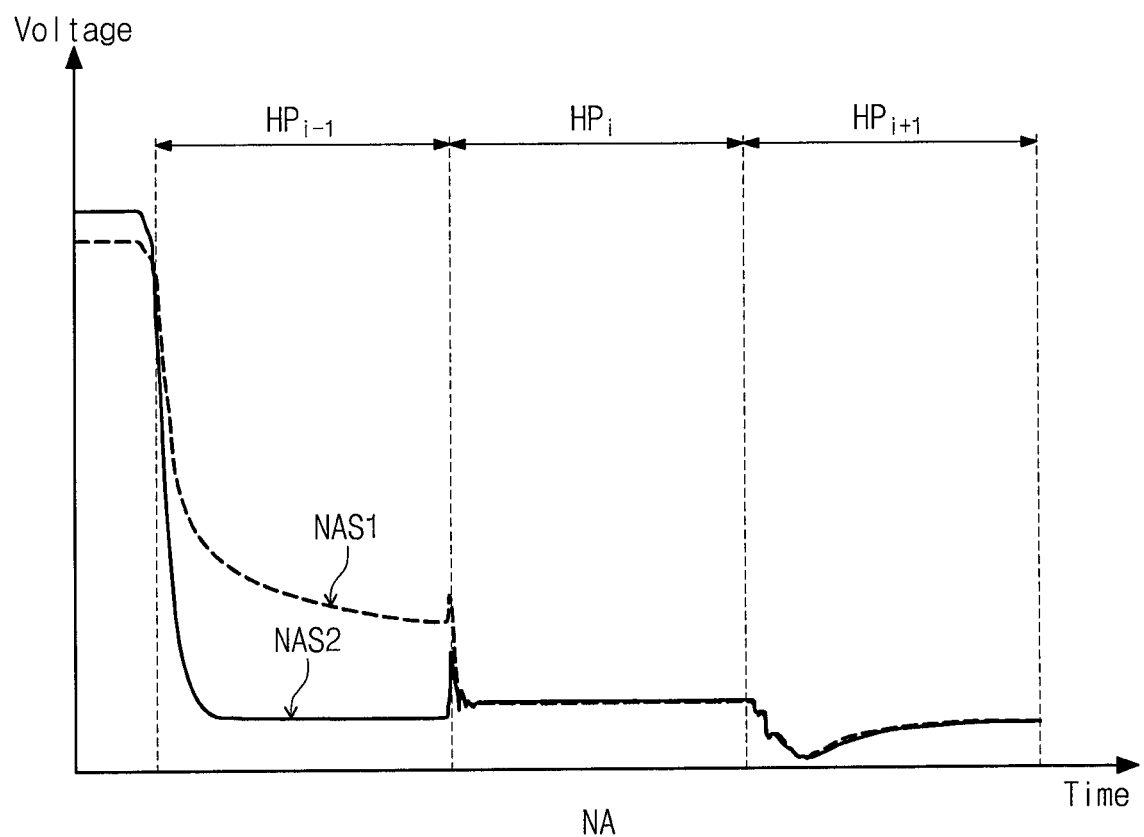
FIG. 9 is an output signal waveform diagram of an A-node NA shown in FIG. 6.

FIG. 9 is an output signal waveform diagram of an A-node NA shown in FIG. 6. A first A-node signal NAS1 and a second A-node signal NAS2 in an i−1th horizontal section HPi−1, an ith horizontal section HPi, and an i+1th horizontal section HPi+1 are shown in FIG. 9.

Unlike the embodiment shown in FIG. 6, if there is no fourth inverter transistor TR9 (see FIG. 6), the first A-node signal NAS1 is a signal outputted from the A-node NA. As shown in FIG. 9, in relation to the first A-node signal NAS1, a speed at which a potential level is reduced is relatively slow in the i-th horizontal section HPi−1. This is because a potential level of the first A-node signal NAS1 is reduced due to natural discharge.

As shown in FIG. 6, if there is the fourth inverter transistor TR9 (see FIG. 6), the second A-node signal NAS2 is a signal outputted from the A-node NA. As such, a signal outputted from the A-node NA is a switching signal outputted from the inverter unit 140. Accordingly, the first A-node signal NAS1 and the second A-node signal NAS2 are switching signals outputted from the inverter unit 140.

The first A-node signal NAS1 and the second A-node signal NAS2 have a similarity in that they all are maintained in a low voltage state in an i−1th horizontal section HPi−1, an ith horizontal section HPi, and an i+1th horizontal section HPi+1. However, there is a slight difference in a potential level of a low voltage state and especially, a potential level difference in the i-th horizontal section HPi−1 is greater.

As shown in FIG. 6, the control electrode of the first inverter transistor TR6 is connected to the B-node NB. When the second B-node signal NBS2 (see FIG. 8) is applied to the control electrode of the first inverter transistor TR6 instead of the first B-node signal NBS1 (see FIG. 8), the first inverter transistor TR6 responds better to an applied signal. This is because a potential level of the second B-node signal NBS2 (see FIG. 8) is higher than a potential level of the first B-node signal NBS1 (see FIG. 8). Accordingly, unlike the first A-node signal NAS1, in relation to the second A-node signal NAS2, a speed at which a potential level is reduced is faster due to the influence of the first inverter transistor TR6.

Referring to FIGS. 6 and 7, in the i−1th horizontal section HPi−1, the first inverter transistor TR6 outputs the low voltage VL-C of the first clock signal CKV to the A-node NA in response to the first B-node signal NBS1 or the second B-node signal NBS2 outputted from the B-node NB. As described above, when the second B-node signal NBS2 is applied to the control electrode of the first inverter transistor TR6 instead of the first B-node NBS1, the first inverter transistor TR6 responds better to a signal applied to the control electrode so that the low voltage VL-C of the first clock signal CKV is better outputted to the A-node NA.

Accordingly, as shown in FIGS. 7 and 9, in the i−1th horizontal section HPi−1, a potential level of the second A-node signal NAS2 is lower than a potential level of the first A-node signal NAS1. Additionally, in the i−1th horizontal section HPi−1, compared to a potential level of the first A-node signal NAS1, a potential level of the second A-node signal NAS2 is more similar to a low voltage VL-C of the first clock signal CKV. This is because when the second B-node signal NBS2 is applied to the control electrode of the first inverter transistor TR6, the first inverter transistor TR6 better outputs the low voltage VL-C of the first clock signal CKV to the A-node NA.

Figure 10:
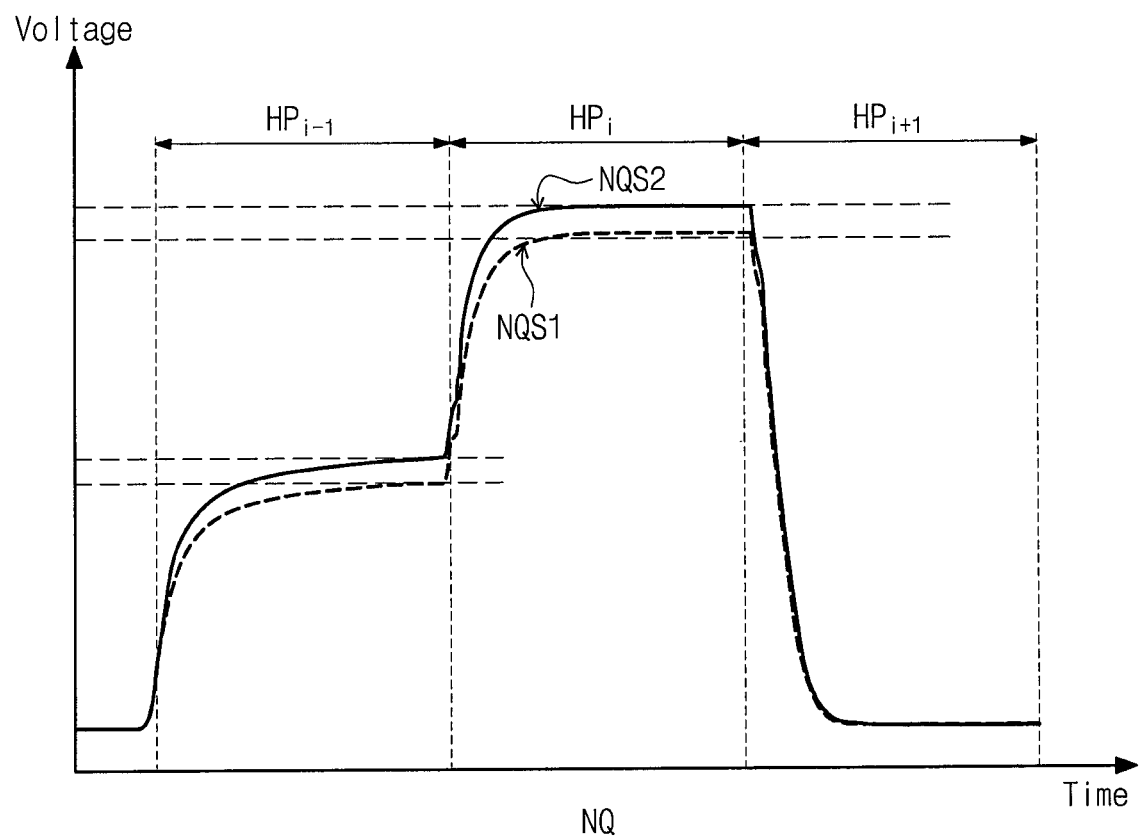
FIG. 10 is an output signal waveform diagram of a Q-node NQ shown in FIG. 6.

FIG. 10 is an output signal waveform diagram of a Q-node NQ shown in FIG. 6. A first Q-node signal NQS1 and a second Q-node signal NQS2 in an i−1th horizontal section HPi−1, an ith horizontal section HPi, and an i+1th horizontal section HPi+1 are shown in FIG. 8.

Unlike that shown in FIG. 6, if there is no fourth inverter transistor TR9 (see FIG. 6), the first Q-node signal NQS1 is a signal outputted from the Q-node NQ. As shown in FIG. 6, if there is the fourth inverter transistor TR9 (see FIG. 6), the second Q-node signal NQS2 is a signal outputted from the Q-node NQ.

There is a slight difference between the potential levels of the first Q-node signal NQS1 and the second Q-node signal NQ2. The potential level of the second Q-node signal NQS2 is higher than the potential level of the first Q-node signal NQS1, and this difference appears more noticeably in the i−1th horizontal section HPi−1 and the ith horizontal section HPi. As shown in FIG. 9, this is due to a potential level difference between the first A-node signal NAS1 and the second A node signal NAS2 applied to the control electrodes of the first stabilization transistor TR5-1 and the second stabilization transistor TR5-2 through the A-node NA in the i-th horizontal section HPi−1.

When the first A-node signal NAS1 having a higher potential level than the second A-node signal NAS2 is applied to the control electrodes of the first stabilization transistor TR5-1 and the second stabilization transistor TR5-2 in the i-the horizontal section HPi−1, the first stabilization transistor TR5-1 and the second stabilization transistor TR5-2 may be turned on. Accordingly, a second leakage current flowing from the Q-node NQ (see FIG. 6) toward the second voltage input terminal V2 in the i-the horizontal section HPi−1 occurs.

When the second leakage current occurs in the i-th horizontal section HPi−1 occurs, the potential level of the Q-node NQ drops and according to this potential level, the capacitor CAP is charged. As a voltage charged to the capacitor CAP drops, the potential level of the Q-node NQ drops in the ith horizontal section HPi boosted therefrom. As such, if there is no fourth inverter transistor TR9, a signal outputted from the Q-node NQ is the first Q-node signal NQS1.

When the second A-node signal NAS2 having a lower potential level than the first A-node signal NAS1 is applied to the control electrodes of the first stabilization transistor TR5-1 and the second stabilization transistor TR5-2 in the i-the horizontal section HPi−1, the first stabilization transistor TR5-1 and the second stabilization transistor TR5-2 may not be turned on. The reason is that the potential level of the second A-node signal NAS2 is sufficiently low in the i-th horizontal section HPi−1. Accordingly, the second leakage current does not occur. Since the second leakage current does not occur, the potential level of the Q-node NQ does not drop. In such a way, if there is the fourth inverter transistor TR9, a signal outputted from the Q-node NQ is the second Q-node signal NQS2.

That is, due to a potential level difference of switching signals outputted to the A-node NA, the potential level of the second Q-node signal NQS2 is higher than the potential level of the first Q-node signal NQS1 in the i−1 the horizontal section HPi−1 and the ith horizontal section HPi.

When the above described contents are summarized with reference to FIG. 6, then there is the fourth inverter transistor TR9, the first leakage current flowing from the B-node NB toward the second voltage input terminal V2 in response to a weak voltage rise of the ith carry signal CRSi generated from the i−1th horizontal section HPi−1.

When the first leakage current is prevented or blocked, the potential level of the B-node NB rises and accordingly, the first inverter transistor TR6 better responds by the output of the B-node NB. Accordingly, the first inverter transistor TR6 better outputs the low voltage VL-C of the first clock signal CKV to the A-node NA in the i−1 th horizontal section HPi−1.

When the potential level of the A-node NA becomes low like the low voltage VL-C of the first clock signal CKV, the first stabilization transistor TR5-1 and the second stabilization transistor TR5-2 are not turned on. Accordingly, the second leakage current flowing from the Q-node NQ into the second voltage input terminal V2 does not occur, so that the potential level of the Q-node NQ does not drop and is maintained stably.

When the potential level of the Q-node NQ is stable, the gate signal GSi and the carry signal CRSi are stably outputted. This is because the control electrodes of the first output transistor TR1 and the second output transistor TR2 responsible for the output of the gate signal GSi and the carry signal CRSi are connected to the Q-node NQ.

Figure 11:
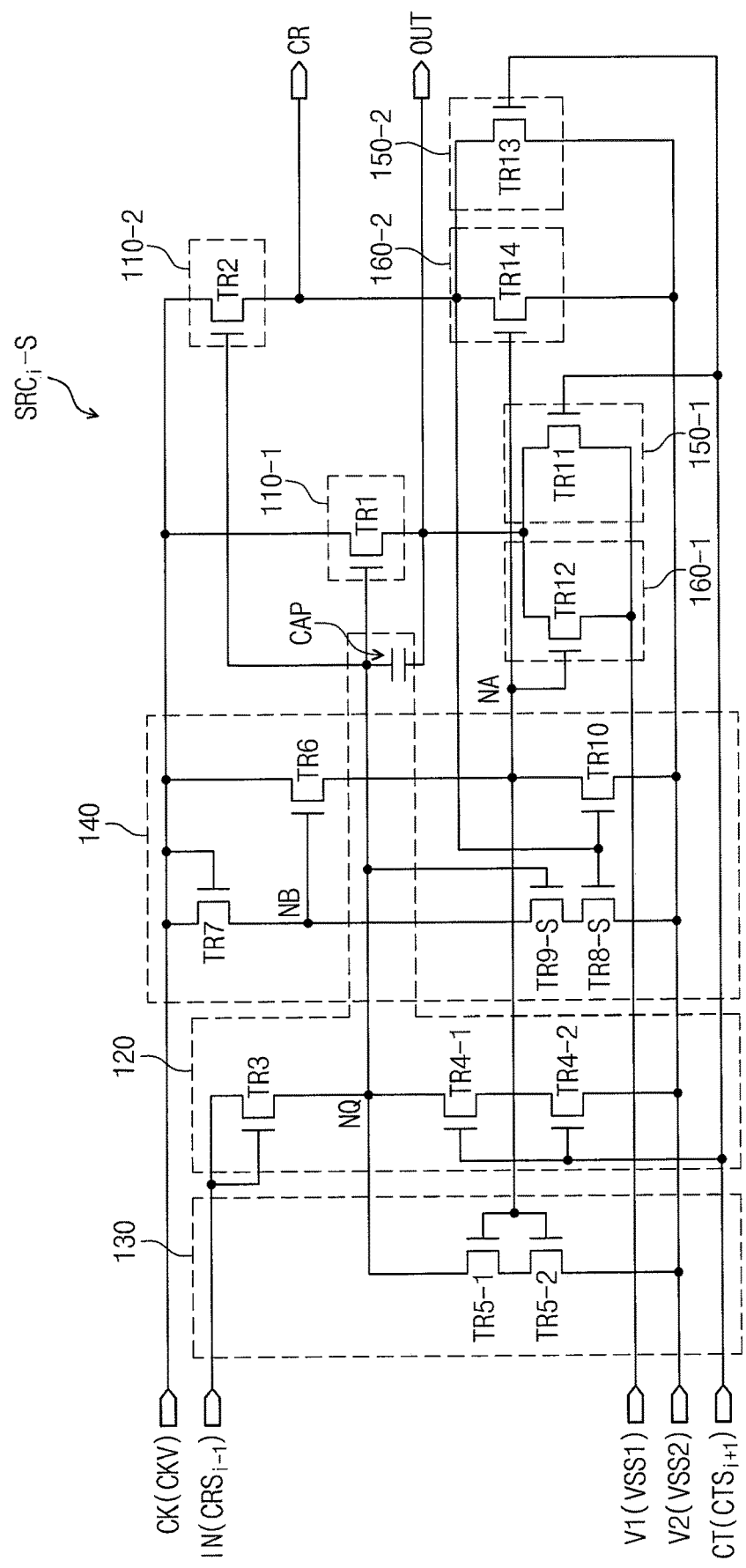
FIG. 11 is a circuit diagram of an ith driving stage among a plurality of stages shown in FIG. 5 according to an embodiment of the present invention.

FIG. 11 is a circuit diagram of an ith driving stage among a plurality of stages shown in FIG. 6 according to an embodiment of the present disclosure. The control electrode of the fourth inverter transistor TR9-S is connected to the Q-node NQ in the ith driving stage SRCi-S shown in FIG. 11.

Referring to FIG. 7, when the output of the carry signal CRSi is a high voltage VH-C, the output of the Q-node NQ is a second high voltage VQ2. That is, when the fourth inverter transistor TR9 shown in FIG. 6 is turned on, the fourth inverter transistor TR9-S shown in FIG. 11 is also in an on state. Accordingly, the ith driving stage SRCi-S shown in FIG. 11 may provide the same function as the ith driving stage SRCi shown in FIG. 6. The control electrode of the third inverter transistor TR8-S in addition to the fourth inverter transistor TR9-S may be connected to the Q-node NQ.

A connection relationship of an input electrode and an output electrode except for a connection relationship of the third inverter transistor TR8-S and the fourth inverter transistor TR9-S is identical to a connection relationship of the third inverter transistor TR8 and the fourth inverter transistor TR9 described with reference to FIG. 6. Additionally, a connection relationship of the remaining transistors included in the ith driving stage SRCi-S is identical to a connection relationship of transistors included in the ith driving stage SRCi described with reference to FIG. 6.

According to an embodiment of the present disclosure, a leakage current occurring from a node included in an inverter unit may be prevented. Accordingly, a highly reliable gate driving circuit and a display device including the same may be provided.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A gate driving circuit comprising a plurality of driving stages, wherein an ith driving stage of the plurality of driving stages comprises:
    an output unit configured to output an ith output signal, the output signal including a high voltage and a low voltage, the high voltage is generated based on a clock signal in response to a voltage of a Q-node;
    a stabilization unit configured to provide the low voltage to the Q-node in response to a switching signal applied to an A-node after the ith output signal is outputted; and
    an inverter unit configured to output the switching signal to the A-node for controlling the stabilization unit, the inverter unit comprising:
        a first inverter transistor configured to provide the switching signal generated based on the clock signal to the A-node, in response to a voltage of a B- node;
        a second inverter transistor configured to control the voltage of the B-node based on the clock signal, in response to the clock signal; and
        a third inverter transistor configured to output the low voltage in response to the ith output signal; and
    a fourth inverter transistor configured to be turned on in a section where the ith output signal is outputted to deliver an output of the third inverter transistor to the B-node,
    wherein i is a natural number equal to or greater than 2.

2. The gate driving circuit of claim 1, wherein
    the first inverter transistor comprises an input electrode configured to receive the clock signal, a control electrode connected to the B-node, and an output electrode connected to the A-node;
    the second inverter transistor comprises an input electrode and a control electrode both configured to commonly receive the clock signal and an output electrode connected to the B-node;
    the third inverter transistor comprises an input electrode configured to receive the low voltage, a control electrode configured to receive the ith output signal, and an output electrode connected to an input electrode of the fourth inverter transistor; and
    the fourth inverter transistor comprises an input electrode connected to an output electrode of the third inverter transistor, a control electrode configured to receive the ith output signal, and an output electrode connected to the B-node.

3. The gate driving circuit of claim 2, wherein the inverter unit further comprises a fifth inverter transistor configured to provide the low voltage to the A-node in response to the ith output signal.

4. The gate driving circuit of claim 3, wherein the fifth inverter transistor comprises:
    an input electrode configured to receive the low voltage;
    a control electrode configured to receive the ith output signal; and
    an output electrode connected to the A-node.

5. The gate driving circuit of claim 4, wherein the stabilization unit comprises a first stabilization transistor and a second stabilization transistor connected in series to each other and configured to output the low voltage to the Q-node in response to a voltage of the A-node.

6. The gate driving circuit of claim 5, wherein
    the first stabilization transistor comprises an input electrode connected to an output electrode of the second stabilization transistor, a control electrode connected to the A-node, and an output electrode connected to the Q-node; and
    the second stabilization transistor comprises an input electrode configured to receive the low voltage, a control electrode connected to the A-node, and an output electrode connected to an input electrode of the first stabilization transistor.

7. The gate driving circuit of claim 6, wherein
    the low voltage comprises a first low voltage and a second low voltage, the first low voltage being different from the second low voltage;
    the ith output signal comprises:
        an ith gate signal comprising the first low voltage and the high voltage; and
        an ith carry signal comprising the second low voltage and the high voltage; and
    the output unit comprises a first output unit configured to output the gate signal, and a second output unit configured to output the ith carry signal.

8. The gate driving circuit of claim 7, wherein the ith driving stage further comprises a control unit configured to control a potential level of the Q-node during a section where i−1th, ith, and i+1th output signals are outputted.

9. The gate driving circuit of claim 8, wherein the ith driving stage further comprises:
    a first pull-down unit configured to pull down the gate signal outputted from the first output unit to the first low voltage; and
    a second pull-down unit configured to pull down the carry signal outputted from the second output unit to the second low voltage.

10. The gate driving circuit of claim 9, wherein the ith driving stage further comprises:
    a first holding unit configured to maintain the gate signal as the first low voltage after the gate signal is pulled down to the first low voltage; and
    a second holding unit configured to maintain the carry signal as the second low voltage after the carry signal is pulled down to the second low voltage.

11. The gate driving circuit of claim 10, wherein a potential level of the second low voltage is less than a potential level of the first low voltage.

12. The gate driving circuit of claim 1, wherein
    the first inverter transistor comprises an input electrode configured to receive the clock signal, a control electrode connected to the B-node, and an output electrode connected to the A-node;
    the second inverter transistor comprises an input electrode and a control electrode both configured to commonly receive the clock signal and an output electrode connected to the B-node;

the third inverter transistor comprises an input electrode configured to receive the low voltage, a control electrode configured to receive the output signal, and an output electrode connected to an input electrode of the fourth inverter transistor; and the fourth inverter transistor comprises an input electrode connected to an output electrode of the third inverter transistor, a control electrode connected to the Q-node, and an output electrode connected to the B-node.

13. The gate driving circuit of claim 12, wherein the inverter unit further comprises a fifth inverter transistor configured to provide the low voltage to the A-node in response to the output signal.

14. The gate driving circuit of claim 13, wherein the fifth inverter transistor comprises:
an input electrode configured to receive the low voltage;
a control electrode configured to receive the output signal; and
an output electrode connected to the A-node.

15. The gate driving circuit of claim 14, wherein the stabilization unit comprises a first stabilization transistor and a second stabilization transistor connected in series to each other, and configured to output the low voltage to the Q-node in response to a voltage of the A-node,
wherein
the first stabilization transistor comprises an input electrode connected to an output electrode of the second stabilization transistor, a control electrode connected to the A-node, and an output electrode connected to the Q-node; and
the second stabilization transistor comprises an input electrode configured to receive the low voltage, a control electrode connected to the A-node, and an output electrode connected to an input electrode of the first stabilization transistor.

16. The gate driving circuit of claim 15, wherein
the low voltage comprises a first low voltage and a second low voltage, the first low voltage being different in level from the second low voltage;
the ith output signal comprises:
an ith gate signal comprising the first low voltage and the high voltage; and
an ith carry signal comprising the second low voltage and the high voltage; and
the output unit comprises a first output unit configured to output the gate signal, and a second output unit configured to output the ith carry signal.

17. The gate driving circuit of claim 16, wherein the ith driving stage further comprises:
a control unit configured to control a potential level of the Q-node during a section where i−1th, ith, and i+1th output signals are outputted;
a first pull-down unit configured to pull down the gate signal outputted from the first output unit to the first low voltage;
a second pull-down unit configured to pull down the carry signal outputted from the second output unit to the second low voltage;
a first holding unit configured to maintain the gate signal as the first low voltage after the gate signal is pulled down to the first low voltage; and
a second holding unit configured to maintain the carry signal as the second low voltage after the carry signal is pulled down to the second low voltage.

18. The gate driving circuit of claim 17, wherein the second low voltage is less in level than the first low voltage.

* * * * *